United States Patent
Huang

(10) Patent No.: US 10,164,616 B2
(45) Date of Patent: Dec. 25, 2018

(54) LEVEL SHIFT CIRCUIT

(71) Applicant: NUVOTON TECHNOLOGY CORPORATION, Hsinchu (TW)

(72) Inventor: Ming-Hsin Huang, Hsinchu (TW)

(73) Assignee: NUVOTON TECHNOLOGY CORPORATION, Hsinchu (TW)

( * ) Notice: Subject to any disclaimer, the term of this patent is extended or adjusted under 35 U.S.C. 154(b) by 0 days.

(21) Appl. No.: 15/984,160

(22) Filed: May 18, 2018

(65) Prior Publication Data

US 2018/0343003 A1 Nov. 29, 2018

Related U.S. Application Data

(60) Provisional application No. 62/511,645, filed on May 26, 2017.

(51) Int. Cl.
| | | |
|---|---|---|
| *H03B 1/00* | (2006.01) | |
| *H03K 3/00* | (2006.01) | |
| *H03K 3/356* | (2006.01) | |
| *H02M 3/07* | (2006.01) | |

(52) U.S. Cl.
CPC ......... *H03K 3/356017* (2013.01); *H02M 3/07* (2013.01)

(58) Field of Classification Search
USPC .................................................. 327/108–112
See application file for complete search history.

(56) References Cited

U.S. PATENT DOCUMENTS

| | | | | |
|---|---|---|---|---|
| 4,623,799 A | * | 11/1986 | Nyman, Jr. .... | H03K 19/017581 324/73.1 |
| 4,933,648 A | * | 6/1990 | Frogge ................... | G05F 3/262 326/83 |
| 5,381,114 A | * | 1/1995 | Pena-Finol ......... | H03F 3/45192 330/253 |
| 5,491,437 A | * | 2/1996 | Rincon ................. | H03F 3/3067 323/315 |
| 5,504,444 A | * | 4/1996 | Neugebauer ............ | H03F 3/005 323/315 |
| 5,534,810 A | * | 7/1996 | White .................... | H03F 1/307 327/108 |
| 5,818,269 A | * | 10/1998 | Brown ............... | H03K 17/6872 327/108 |

(Continued)

*Primary Examiner* — Adam Houston
(74) *Attorney, Agent, or Firm* — Muncy, Geissler, Olds & Lowe, P.C.

(57) ABSTRACT

A level shift circuit is provided, which includes a boost circuit and a voltage converting circuit. The boost circuit is coupled to a first high voltage terminal to receive an input voltage signal. The boost circuit includes at least one low threshold voltage element and is configured to boost the input voltage signal. The voltage converting circuit is coupled to a second high-voltage terminal and includes a low-pass filter circuit, a high-pass filter circuit, an upper switch element and a lower switch element. The upper switch element and the lower switch element are electrically cascaded between the second high-voltage terminal and a low voltage terminal. The low-pass filter circuit and the high-pass filter are electrically connected between the control terminal of the upper switch element and the control terminal of the lower switch element. The upper switch element and the lower switch element are standard threshold voltage elements.

11 Claims, 8 Drawing Sheets

(56) References Cited

U.S. PATENT DOCUMENTS

| | | | | |
|---|---|---|---|---|
| 7,868,666 B2* | 1/2011 | Huang | H03K 19/018521 | 326/70 |
| 8,610,484 B2* | 12/2013 | Udayashankar | H03K 5/08 | 327/108 |
| 10,014,853 B1* | 7/2018 | Yang | H03K 17/6871 | |
| 2005/0189934 A1* | 9/2005 | Poss | G05F 1/575 | 323/316 |
| 2009/0108884 A1* | 4/2009 | Dagli | H03F 3/2171 | 327/109 |
| 2010/0259298 A1* | 10/2010 | Huang | H03K 19/0013 | 326/71 |
| 2012/0056672 A1* | 3/2012 | Galal | H03F 1/301 | 330/277 |
| 2013/0222015 A1* | 8/2013 | Chern | H03K 19/018521 | 327/109 |
| 2014/0184340 A1* | 7/2014 | Snoeij | H03F 3/3028 | 330/300 |
| 2015/0022248 A1* | 1/2015 | Fukami | H01L 27/0883 | 327/110 |
| 2015/0117675 A1* | 4/2015 | Jennings | H04R 3/00 | 381/94.1 |
| 2015/0137856 A1* | 5/2015 | de Haas | H03K 3/012 | 327/108 |
| 2015/0365087 A1* | 12/2015 | Vogt | H03K 17/687 | 327/109 |
| 2016/0006425 A1* | 1/2016 | Waltener | G02F 1/011 | 385/2 |
| 2016/0144616 A1* | 5/2016 | Yamada | B41J 2/04541 | 347/10 |
| 2016/0144617 A1* | 5/2016 | Yamada | B41J 2/04508 | 347/10 |
| 2016/0167370 A1* | 6/2016 | Uematsu | B41J 2/04588 | 347/68 |
| 2016/0255685 A1* | 9/2016 | Melanson | H05B 33/0815 | 327/109 |

* cited by examiner

LEVEL SHIFT CIRCUIT

CROSS-REFERENCE TO RELATED APPLICATION

This application claims priority from the U.S. Provisional Patent Application No. 62/511,645, filed on May 26, 2017 at United States Patent and Trademark Office, the contents of which are hereby incorporated by reference in their entirety for all purposes.

BACKGROUND OF THE INVENTION

1. Field of the Invention

The present invention is related to a level shift circuit, in particular, is related to a level shift circuit which is able to reduce quiescent current and be operated in a voltage condition lower than a standard threshold voltage.

2. Description of the Related Art

A level shift circuit is a circuit commonly used in a microcontroller unit (MCU). A traditional level shift circuit is implemented by latch architecture and a standard threshold voltage (SVT) element. When a supply voltage VDD is higher than the SVT, the traditional level shift circuit can possess exceptional operation properties and superior reliability.

However, when the traditional level shift circuit is operated under a condition in which the supply voltage VDD is lower than the standard threshold voltage, the propagation delay and the switching frequency of the SVT element may be too low because of the decrease of the driving current of the SVT element. In the other hand, when the level shift circuit is implemented by a low threshold voltage (LVT) element and the latch architecture, this level shift circuit may have a higher operational frequency in a condition in which the supply voltage VDD is lower than the standard threshold voltage, but may also cause power consumption because of the increased quiescent current.

That is, in the condition in which the supply voltage VDD is lower than the standard threshold voltage, utilizing the LVT element may make MCU have an appropriate propagation delay and switching frequency; however, when the supply voltage VDD keeps increasing to be higher than the standard threshold voltage, the LVT element may have a larger quiescent current such that the MCU is unable to fit the predetermined current and power specifications. Hence, the level shift circuit implemented by using only the SVT element or only the LVT element still has problems to be solved.

SUMMARY OF THE INVENTION

In order to solve the above problems, an object of the present invention is to provide a level shift circuit.

According to an embodiment, a level shift circuit includes a boost circuit and a voltage converting circuit. The boost circuit is electrically coupled to a first high-voltage terminal and configured to receive an input voltage signal. The boost circuit includes at least one low-threshold voltage element to boost the input voltage signal. The voltage converting circuit is electrically coupled to a second high-voltage terminal, and includes a current source, a first capacitor element, a first P-type transistor and an N-type transistor. The current source is electrically coupled between the second high-voltage terminal and the first capacitor element, and the first capacitor element is coupled between the current source and an output terminal of the boost circuit, and the first P-type transistor and the N-type transistor are electrically cascaded between the second high-voltage terminal and a low voltage terminal. The gate electrodes of the first P-type transistor and the N-type transistor are coupled to two ends of the first capacitor element individually. The first P-type transistor and the N-type transistor are standard threshold voltage elements.

Preferably, the voltage value at the second-high voltage terminal is higher than the voltage value at the first high-voltage terminal, and the voltage value at the low voltage terminal is lower than the voltage value at the second high-voltage terminal.

Preferably, the low voltage terminal is a ground terminal.

Preferably, at least one low threshold voltage element includes a first phase inverter, a second phase inverter, a second capacitor element, and a second P-type transistor. The input terminal of the first phase inverter and the input terminal of the second phase inverter receive the input voltage signal. The output terminal of the first phase inverter is electrically coupled to an end of the second capacitor element. Another end of the second capacitor element is connected to the drain electrode and the substrate of the second P-type transistor. The output terminal of the second phase inverter is electrically coupled to the gate electrode of the second P-type transistor and configured as an output terminal of the boost circuit. The first power terminal of the first phase inverter is electrically coupled to the first high voltage terminal. The first power terminal of the second phase inverter is electrically coupled to the drain electrode of the second P-type transistor. The source electrode of the second P-type transistor is electrically coupled to the first high voltage terminal. The second power terminals of the first phase inverter and the second phase inverter are electrically coupled to the low voltage terminal.

Preferably, the level shift circuit of the present invention further includes a third phase inverter and a fourth phase inverter. The input terminal of the third phase inverter is electrically coupled to the drain electrode of the first P-type transistor. The output terminal of the third phase inverter is electrically coupled to the input terminal of the fourth phase inverter. The output terminal of the fourth phase inverter is configured as an output terminal of the level shift circuit.

Preferably, the third phase inverter and the fourth phase inverter are the standard threshold voltage elements.

Preferably, the boost circuit is a charge pump circuit.

According to another embodiment, the present invention provides a level shift circuit including: a boost circuit electrically coupled to a first high voltage terminal and configured to receive an input voltage signal, wherein the boost circuit is configured to boost the input voltage signal; and a voltage converting circuit electrically coupled to a second high-voltage terminal, and comprising a low-pass filter circuit, a high-pass filter circuit, an upper switch element and a lower switch element. The upper switch element and the lower switch element are electrically cascaded between the second high-voltage terminal and a low voltage terminal. The low-pass filter circuit and the high-pass filter circuit are electrically connected between a control terminal of the upper switch element and a control terminal of the lower switch element. The upper switch element and the lower switch element are standard threshold voltage elements.

Preferably, the low-pass filter circuit comprises a capacitor element.

Preferably, the high-pass filter circuit comprises a current mirror circuit or a current source.

According to yet another embodiment, the present invention provides a level shift circuit which includes: a boost circuit electrically coupled to a first high voltage terminal and configured to receive an input voltage signal, wherein the boost circuit comprises at least one low-threshold voltage element to boost the input voltage signal; and a voltage converting circuit electrically coupled to a second high-voltage terminal, and comprising a current source, a first capacitor element, a first P-type transistor and a N-type transistor. The current source is electrically coupled between the second high-voltage terminal and the first capacitor element; the first capacitor element is coupled between the current source and the output terminal of the boost circuit; the first P-type transistor and the N-type transistor are electrically cascaded between the second high-voltage terminal and a low voltage terminal; and gate electrodes of the first P-type transistor and the N-type transistor are coupled to two ends of the first capacitor element individually.

DESCRIPTION OF THE PREFERRED EMBODIMENTS

Here, the implementation of the present disclosure will be described in detail taken in conjunction with appended drawings and embodiments for the ease of realizing how to solve technical problems by applying the technical means and achieve technical effects in the present disclosure.

Figure 1:
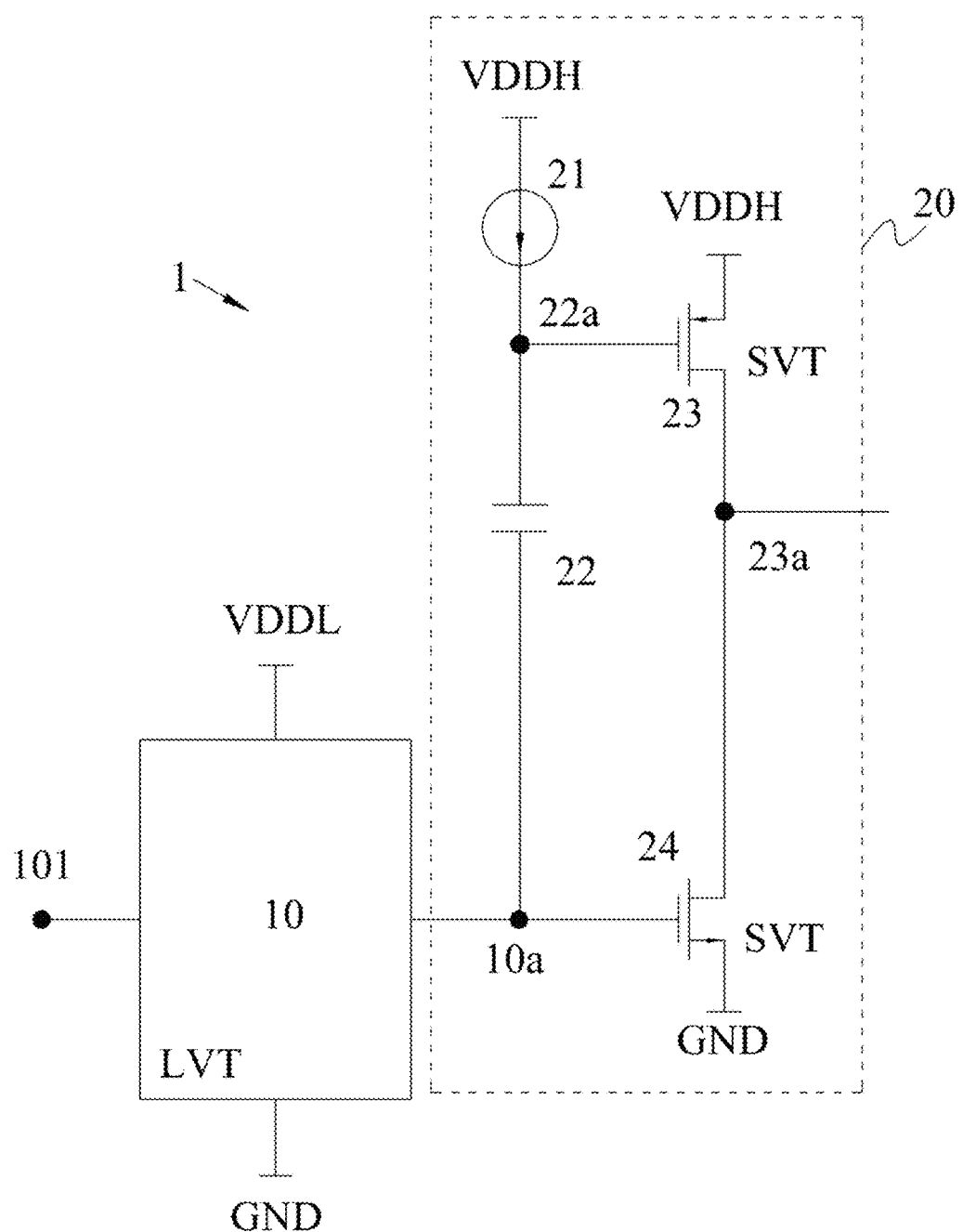
FIG. 1 illustrates a schematic scheme of the level shift circuit of the present invention.

Please refer to FIG. 1, which illustrates a schematic scheme of the level shift circuit of the present invention. Wherein, the level shift circuit includes a boost circuit 10 and a voltage converting circuit 20. The boost circuit 10 is electrically coupled to a first high voltage terminal (having a voltage value of VDDL) to receive an input voltage signal 101. The boost circuit 10 includes at least one low-threshold voltage (LVT) element to boost the input voltage signal 101. In an embodiment, the boost voltage circuit 10 amplifies the amplitude of the input voltage signal 101 for a predetermined multiple.

The voltage converting circuit 20 is electrically coupled to a second high-voltage terminal (having a voltage value of VDDH) and includes a current source 21, a first capacitor element 22, an upper switch element and a lower switch element. In FIG. 1, the upper switch element and the lower switch element are described as, but not limited to, the examples by a first P-type transistor 23 and an N-type transistor 24, respectively. The voltage value VDDH at the second high-voltage terminal is higher than the voltage value VDDL at the first high voltage terminal.

The current source 21 is electrically coupled between the second high-voltage terminal (having a voltage value of VDDH) and the first capacitor element 22. The first capacitor element 22 is coupled between the current source 21 and the output circuit 10 (i.e. node 10a) of the boost circuit 10. The first P-type transistor 23 and the N-type transistor 24 are electrically cascaded between the second high-voltage terminal and the low voltage terminal. Further, the gate electrodes of the first P-type transistor 23 and the N-type transistor 24 are coupled to the two end of the first capacitor element 22 individually. The first P-type transistor 23 and the N-type transistor 24 are standard threshold voltage (SVT) elements.

The voltage value at the low voltage terminal is lower than the voltage VDDL at the first high voltage terminal and the voltage VDDH at the second high-voltage terminal. In an embodiment, the low voltage terminal is a ground terminal GND.

Figure 2:
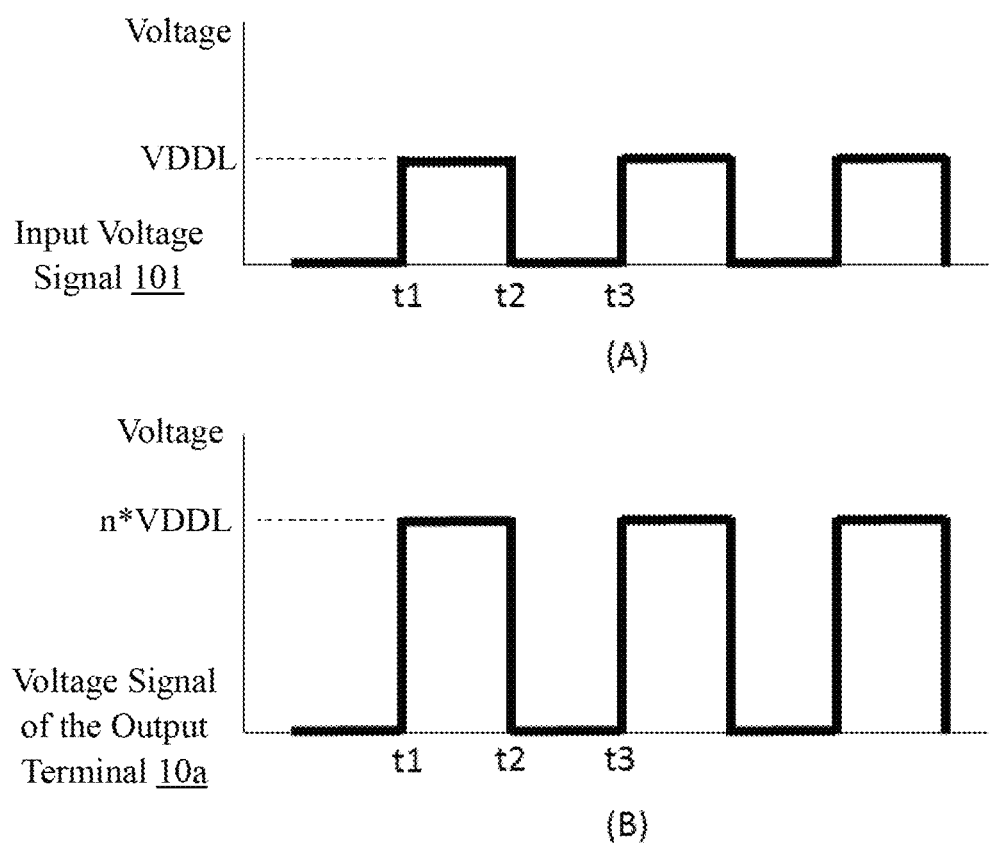
FIGS. 2 and 3 illustrate waveform diagram of voltage signals of the level shift circuit of the present invention on a plurality of nodes.

The operation of the level shift circuit of the present invention will be described below taken in conjunction with FIGS. 1, 2 and 3.

The input terminal of the boost circuit 10 receives the input voltage signal 101 with the amplitude of VDDL. In this embodiment, as shown in the part (A) of FIG. 2, the low level of the input voltage signal 101 is 0 and the high level is VDDL. After the voltage is boosted by the boost circuit 10, the boosted voltage signal with the amplitude of n*VDDL, that is n multiplied by VDDL, is outputted from the output terminal of the boost circuit 10, wherein n is an integer larger than 1. In this embodiment, as shown in the part (B) of FIG. 2, the low level of the voltage signal at the node 10a is 0 and the high level is n*VDDL.

The voltage signal at the node 10a may be utilized to turn on or off the N-type transistor 24. When the voltage signal at the node 10a is at the high level, the N-type transistor 24 is turned on; and when the voltage signal at the node 10a is at the low level, the N-type transistor 24 is turned off.

The current source 21 provides current to charge the first capacitor element 22. Because of the electrical property of a capacitor element, the transient voltage difference between the two ends of the first capacitor element 22 may be not shifted. Thus, when the voltage signal at the node 10a is shifted between the high level and the low level, the voltage difference between the two ends of the first capacitor element 22 is still fixed, so that another end (i.e. the node 22a) of the first capacitor element 22 may be shifted correspondingly.

Figure 3:
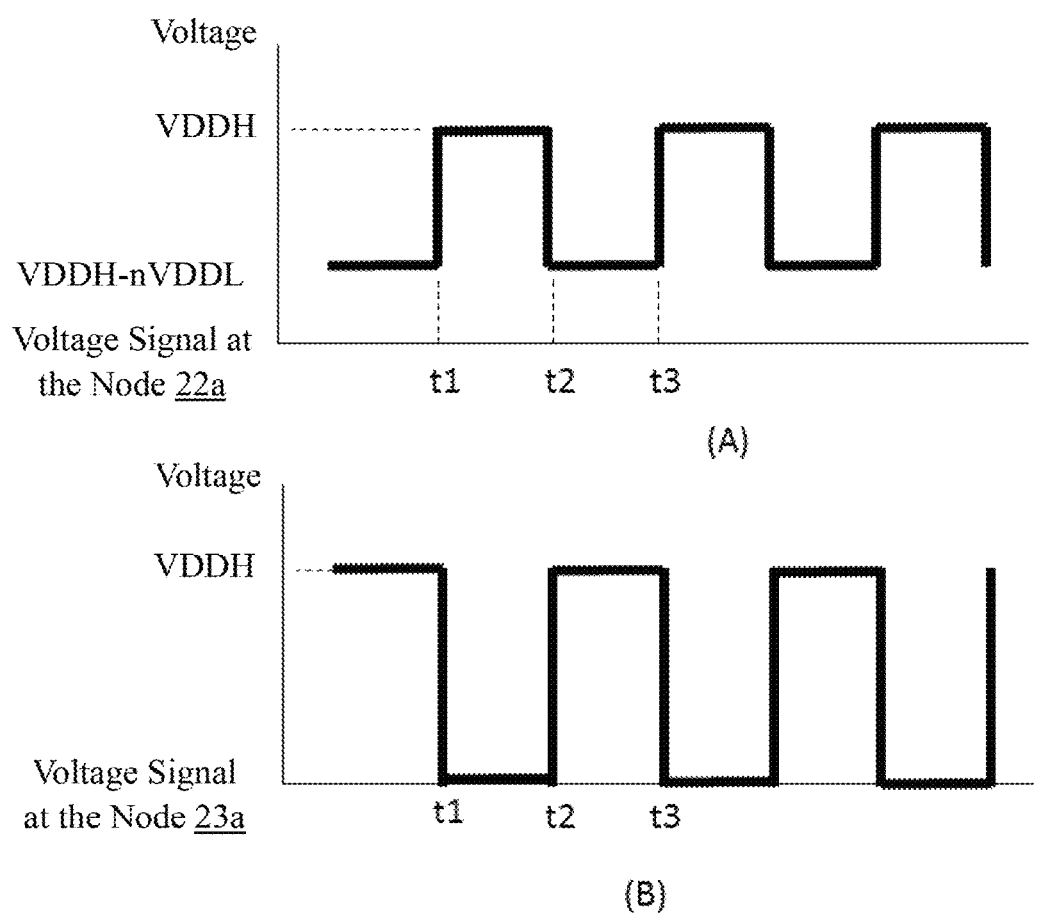

In detail, as shown in the part (A) of FIG. 3, when the voltage signal at the node 10a has a voltage value of n*VDDL, the transient voltage difference between the two ends of the first capacitor element 22 is VDDH−n*VDDL, and the voltage value at the node 22a is VDDH. Hence, when the voltage value of the voltage signal at the node 10a is shifted to 0, the transient voltage difference between the two ends of the first capacitor element 22 maintains VDDH−n*VDDL. Therefore, the voltage value at the node 22a is shifted to VDDH−n*VDDL correspondingly.

The voltage value at the node 22a may be utilized to turn on or off the first P-type transistor 23. When the voltage value at the node 22a is VDDH, for instance, the first P-type transistor 23 is turned off between the time points t1 and t2, as shown in the part (A) of FIG. 3. Simultaneously, the voltage value at the node 10a is n*VDDL and the N-type transistor 24 is turned on between the time points t1 and t2, as shown in the part (B) of FIG. 2. Hence, the voltage value at the node 23a is 0.

Similarly, when the voltage value at the node 22a is VDDH−n*VDDL, for instance, the first P-type transistor 23 is turned on between the time points t2 and t3, as shown in the part (A) of FIG. 3. Simultaneously, the voltage value at the node 10a is 0 and the N-type transistor 24 is turned off between the time points t2 and t3, as shown in the part (B) of FIG. 2. Hence, the voltage value at the node 23a is VDDH. Therefore, the voltage at the node 23a represents the voltage signal being the anti-phase of the input voltage signal 101 and has amplitude of VDDH.

In other embodiments, the level shift circuit of the present invention may include a phase inverter coupling node 23a, so that the outputted signal of the phase inverter will be the same phase as the input voltage signal 101 and have a voltage signal with the amplitude of VDDH.

In other embodiments, the voltage signal outputted by the boost circuit 10 of the present invention is the anti-phase of the input voltage signal 101. Hence, the voltage finally represents the voltage signal being the same phase as the input voltage signal 101 and having a voltage signal with the amplitude of VDDH. Preferably, the boost circuit 10 may be a charge pump circuit.

Figure 4:
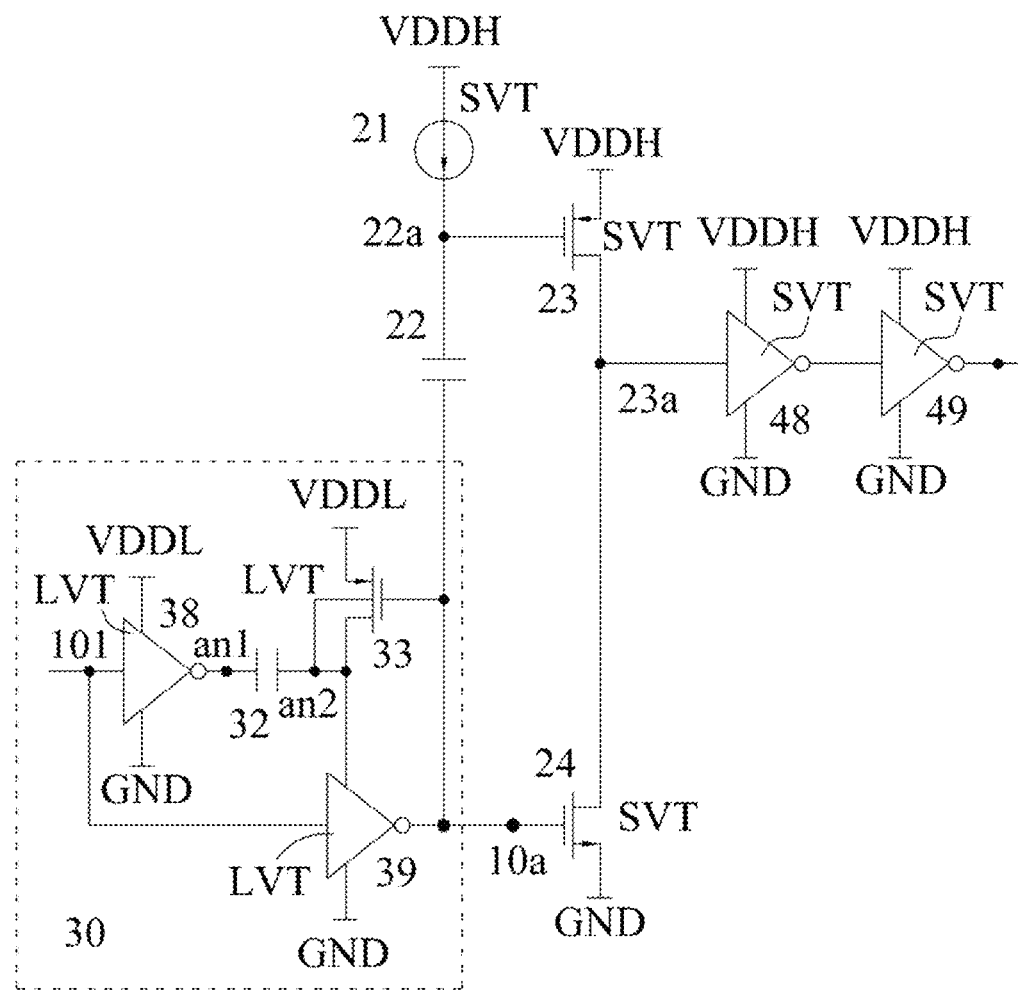
FIG. 4 illustrates schematic view of a first embodiment of the level shift circuit of the present invention.

Please refer to FIG. 4, which illustrates schematic views of an embodiment of the level shift circuit of the present invention. The difference between the level shift circuits of the present embodiment and FIG. 1 is that the present embodiment includes a charge pump circuit 30, and a third phase inverter 48 and a fourth phase inverter 49 both cascaded to the node 23a. The third phase inverter 48 and the fourth phase inverter 49 are SVT elements.

The charge pump circuit 30 includes a first phase inverter 38, a second phase inverter 39, a second capacitor element 32 and a second P-type transistor 33, which are LVT elements. The input terminal of the first phase inverter 38 and the input terminal of the second phase inverter 39 receive the input voltage signal 101. The output terminal of the first phase inverter 38 is electrically coupled to an end an1 of the second capacitor element 32. Another end an2 of the second capacitor element 32 is connected to the drain electrode and the substrate of the second P-type transistor 33. The output terminal of the second phase inverter 39 is electrically couple to the gate electrode of the second P-type transistor 33 and the node 10a. According to the figure, the node 10a is also the output terminal of the charge pump circuit 30.

The first power terminal of the first phase inverter 38 is coupled to the first high voltage terminal (having a voltage value of VDDL), and the first power terminal of the second phase inverter 39 is electrically coupled to the drain electrode of the second P-type transistor 33 and an end an2 of the second capacitor element 32. The source electrode of the second P-type transistor 33 is electrically coupled to the first high voltage terminal VDDL. The second power terminals of the first phase inverter 38 and the second phase inverter 39 are electrically coupled to a low voltage terminal. In the present embodiment, the low voltage terminal is, but not limited to, a ground terminal.

In the present embodiment, the voltage value VDDL at the first high voltage terminal is lower than the standard threshold voltage of the transistor, and the voltage value VDDH at the second high-voltage terminal is higher than the standard threshold voltage of the transistor.

The operation process of the charge pump circuit 30 will be described below taken in conjunction with FIGS. 4, 5 and 6.

The charge pump circuit 30 receives the input voltage signal 101 which is a logical signal. As shown in the part (A) of FIG. 5, the voltage value of the low level part is 0 and that of the high level part is VDDL. When the input voltage signal 101 is at the high level, the first phase inverter 38 outputs a low level signal, that is, the voltage value at the end an1 of the second capacitor element 32 is 0. Similarly, the second phase inverter 39 outputs a low level signal so that the voltage value at the node 10a is 0. At an initial level, the second capacitor element 32 is not charged yet, so that the end an2 of the second capacitor element 32 also has a voltage level of 0 at the initial level. Thus, the second P-type transistor 33 is turned on and the end an2 of the second capacitor element 32 has a voltage value shifted to VDDL. Therefore, the second capacitor element 32 starts to charge, and the voltage difference between the two ends is VDDL.

When the input voltage signal 101 is shifted from the high level to the low level, the first phase inverter 38 outputs a low level signal, so that the voltage value at the end an1 of the second capacitor element 32 is shifted from 0 to VDDL. Because of the electrical property of the capacitor element, the voltage difference as VDDL between the two ends of the second capacitor element 32 is not shifted transiently. Hence, the voltage value at the end an2 of the second capacitor element 32 is shifted to double of VDDL (represented by 2*VDDL in FIG. 5).

Similarly, when the input voltage signal 101 is shifted from the high level to the low level, the second phase inverter 39 outputs a high level signal. As shown in the part (B) of FIG. 5, since the voltage value at the first power terminal of the second phase inverter 39 is double of VDDL at the moment, what the second phase inverter 39 outputting the high level signal means that the voltage value at the node 10a is double of VDDL. Therefore, the charge pump circuit 30 outputs the signal with two times of the amplitude and used as the anti-phase signal of the input voltage signal 101.

Subsequently, as the circuit operation same as FIG. 1, when the voltage signal at the node 10a is the high level (between the time points t2 and t3 of the part (B) of FIG. 5), and the N-type transistor 24 is turned on, the voltage value at the node 23a is 0 (between the time points t2 and t3 of the part (B) of FIG. 6). At the same time, the first capacitor element 22 is charged, the voltage difference between the two ends of the first capacitor element 22 is VDDH−2*VDDL, the voltage value at the node 22a is VDDH (between the time pints t2 and t3 of the part (A) of FIG. 6), and the first P-type transistor 23 is turned off.

Figure 5:
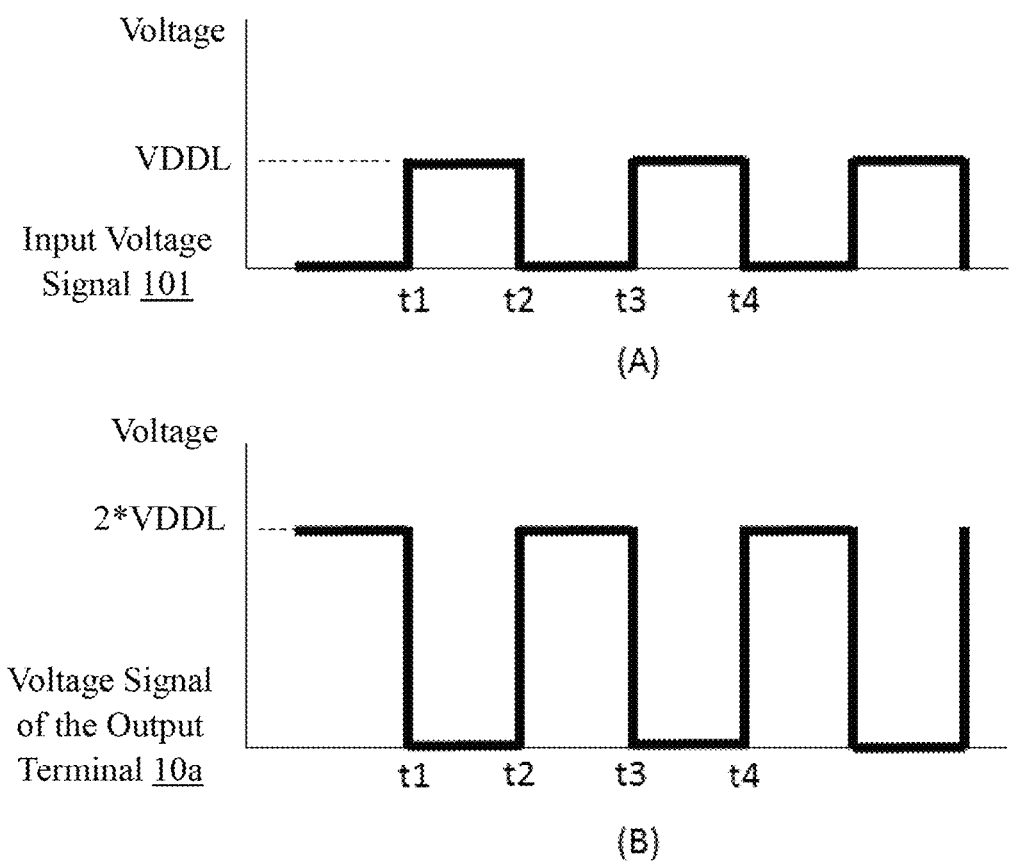
FIGS. 5 and 6 illustrate waveform diagrams of voltage signals of the first embodiment of the level shift circuit of the present invention on a plurality of nodes.
Figure 6:
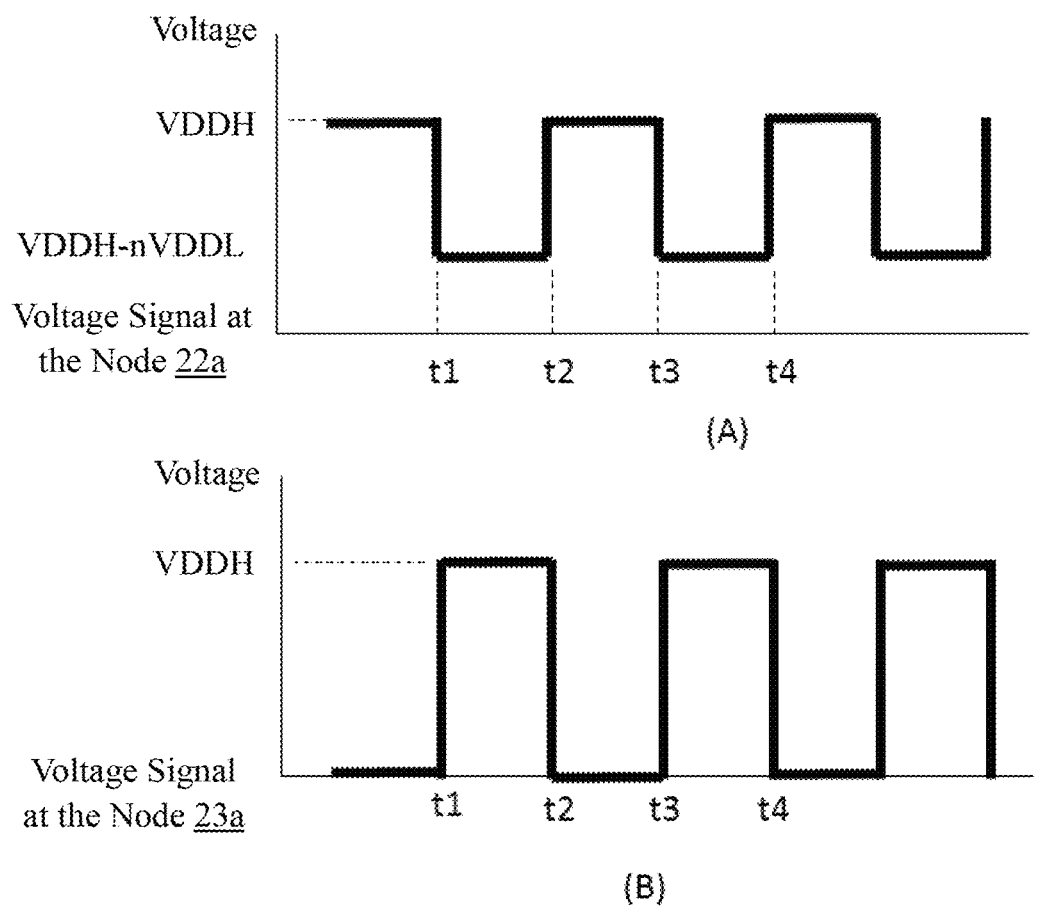

Then, when the voltage signal is shifted from the high level to the low level (between the time points t3 and t4 of the (B) part of FIG. 5), and the N-type transistor 24 is turned off. At the same time, the voltage value of the node 22a is decreased from VDDH to VDDH−2*VDDL (between the time points t3 and t4 of the part (A) of FIG. 6), so that the first P-type transistor 23 is turned on, and the voltage value at the node 23a is VDDH, as shown between the time points t3 and t4 of the part (B) of FIG. 6).

The input terminal of the third phase inverter 48 is electrically coupled to the drain electrode of the first P-type transistor 23, the output terminal of the third phase inverter 48 is electrically coupled to the input terminal of the fourth phase inverter 49, and the output terminal of the fourth phase inverter 49 is configured as the output terminal of the level shift circuit 1.

The level shift circuit of the present invention includes two circuit parts, one of which is connected to the first voltage supply terminal (having the voltage value of VDDL) and is fully composed of LVT elements; whereas another of which is connected to the second voltage supply terminal (having the voltage value of VDDH) and is fully composed of SVT elements. Therefore, when the voltage value at the node 10a is 0, the LVT elements of the present invention are at a condition receiving the voltage value VDDL, so that the quiescent current of the level shift circuit is relatively smaller in comparison with that at a condition receiving the voltage VDDH.

Figure 7:
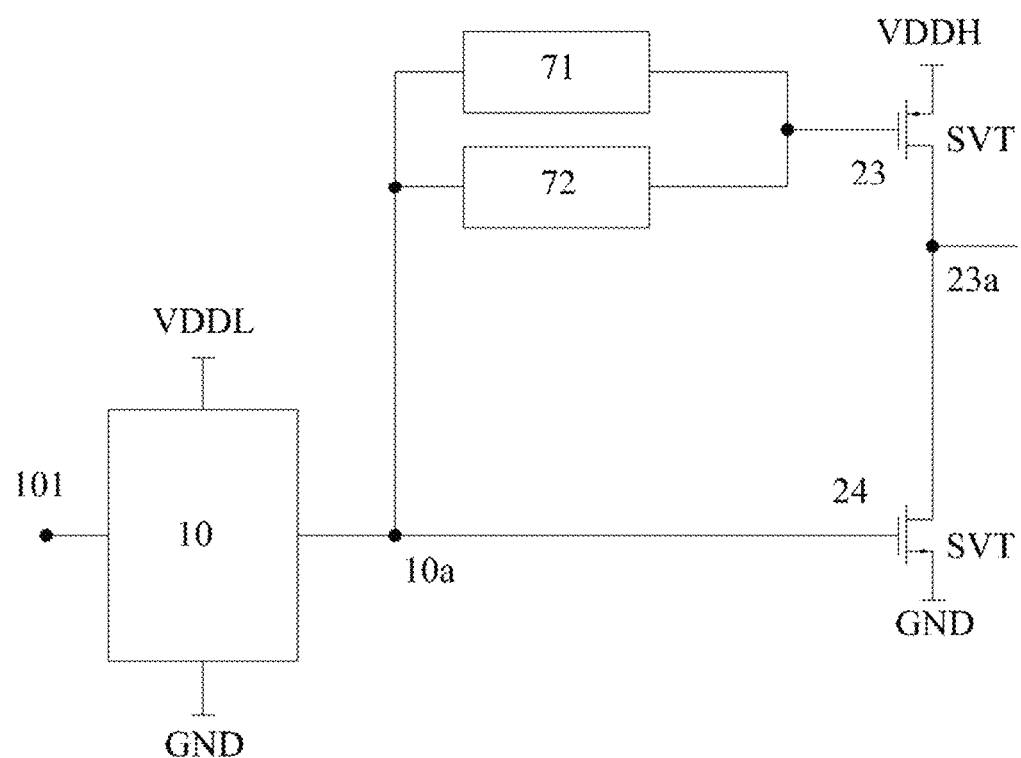
FIG. 7 illustrates a schematic view of the second embodiment of the level shift circuit of the present invention.

Please refer to FIG. 7, which illustrates a schematic scheme of the second embodiment of the level shift circuit of the present invention. The difference between the second embodiment and the first embodiment is that the level shift circuit of the second embodiment includes a low-pass filter circuit 71 and a high-pass filter circuit 72 which are electrically connected between the gate electrode of the N-type transistor 24 and the gate electrode of the first P-type transistor 23.

By using the low-pass filter circuit 71 and the high-pass filter circuit 72, the N-type transistor 24 and the first P-type transistor 23 may be turned on or off synchronously. For instance, when the N-type transistor 24 is turned off, the first P-type transistor 23 is synchronously turned on such that the voltage value at the node 23a is VDDH; and when the N-type transistor 24 is turned on, the first P-type transistor 23 is synchronously turned off such that the voltage value at the node 23a is 0, thereby resulting in a level shift effect.

In detail, when the operation status of the N-type transistor 24 is changed due to the transient change of the voltage at the node 10a, the high-pass filter circuit 72 may transmit the transient change of the voltage to the gate electrode of the first P-type transistor 23 such that the first P-type transistor 23 may change its operational status synchronously.

If the transient change of the voltage is only transmitted by the high-pass filter circuit 72, the quiescent logical status may lack of low frequency parts, that is, the level shift circuit may output unstably in the period without transient change of the voltage at the node 10a. Hence, the low-pass filter circuit 71 may transmit the low frequency part of the quiescent logical status of the level shift circuit.

Preferably, the high-pass filter circuit 72 may be achieved by a capacitor element, and low-pass filter circuit 71 may be achieved by a current mirror or other kinds of current source circuit. However, these are merely exemplary examples and are not intended to limit the present invention.

Figure 8:
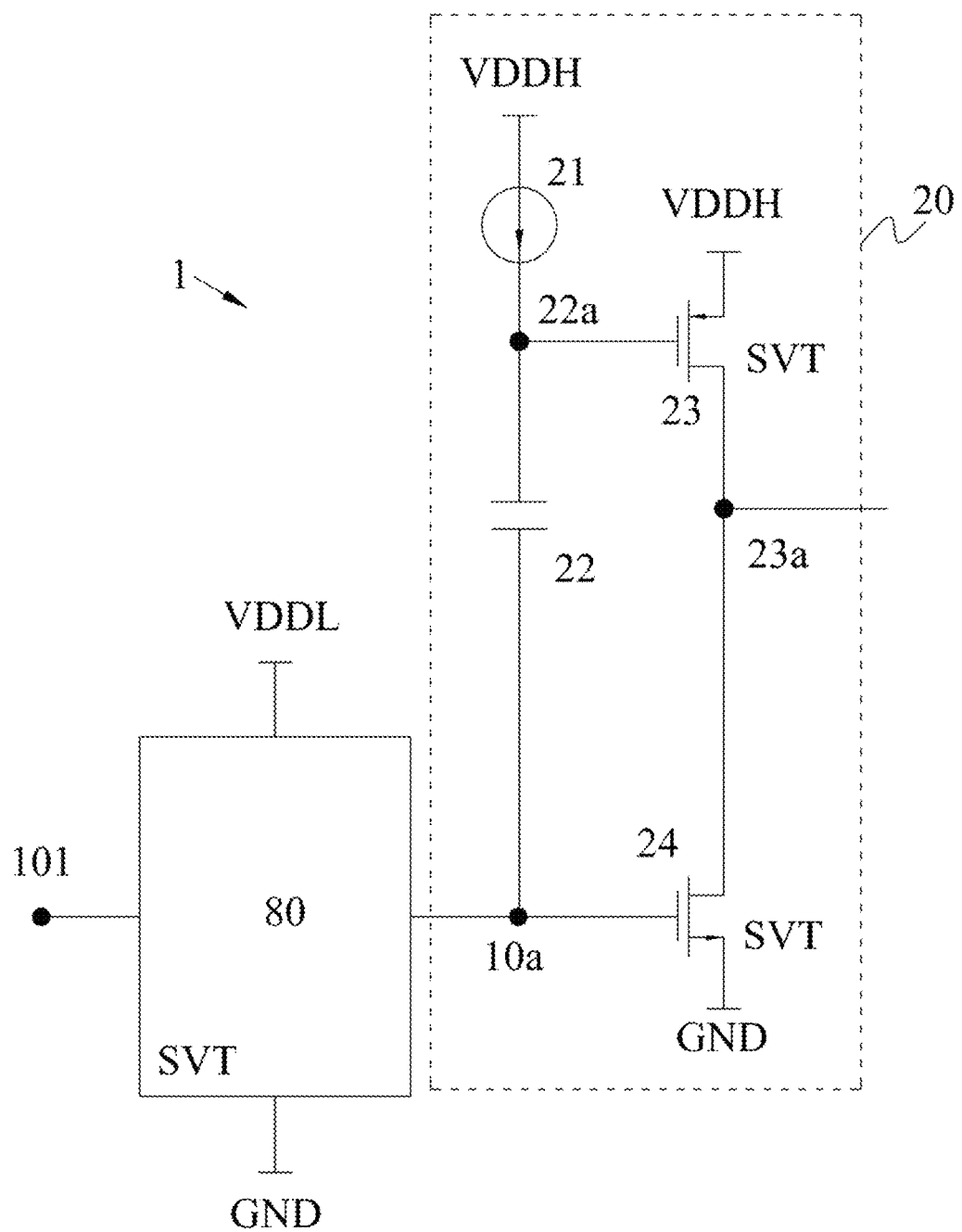
FIG. 8 illustrates a schematic view of yet another embodiment of the level shift circuit of the present invention.

Please refer to FIG. 8, which illustrates a schematic scheme of yet another embodiment of the level shift circuit of the present invention. The present invention further provides a level shift circuit including a boost circuit 80 and a voltage converting circuit 20. The boost circuit 80 is electrically coupled to a first high voltage terminal and configured to receive an input voltage signal 101, and the boost circuit 80 is utilized to boost the input the input voltage signal 101. The voltage converting circuit 20 is electrically coupled to a second high-voltage terminal and comprises a current source 21, a first capacitor element 22, a first P-type transistor 23 and an N-type transistor 24. The current source 21 is electrically coupled between the second high-voltage terminal and the first capacitor element 22. The first capacitor element 22 is coupled between the current source 21 and the output terminal of the boost circuit 80, and the first P-type transistor 23 and the N-type transistor 24 are electrically cascaded between the second high-voltage terminal VDDH and a low voltage terminal. The gate electrodes of the first P-type transistor 23 and the N-type transistor 24 are coupled to the two ends of the first capacitor element 22 individually.

The difference between the present embodiment and the aforementioned embodiments is that the boost circuit 80 includes standard threshold voltage elements. For instance, the circuit architecture within the boost circuit 80 may be similar to the architecture of FIG. 4, but the elements are replaced by the standard threshold voltage elements instead.

The advantages of the present invention is that when the voltage ratio between the voltage VDDL at the first high voltage terminal and the voltage VDDH at the second high-voltage terminal is increased, the level shift circuit of the present embodiment is able to reduce the loss of switching and to increase the shifting speed.

It is to be understood that the present disclosure is not limited to the contents described above. Any equivalent modifications, variations and enhancements can be made thereto by those skilled in the art without changing the essential characteristics or technical spirit of the present disclosure, the technical and protective scope of which is defined by the appending claims.

What is claimed is:

1. A level shift circuit, comprising:
a boost circuit electrically coupled to a first high voltage terminal and configured to receive an input voltage signal, wherein the boost circuit comprises at least one low-threshold voltage element and is configured to boost the input voltage signal; and
a voltage converting circuit electrically coupled to a second high-voltage terminal, and comprising a current source, a first capacitor element, a first P-type transistor and a N-type transistor, wherein:
the current source is electrically coupled between the second high-voltage terminal and the first capacitor element,
the first capacitor element is coupled between the current source and an output terminal of the boost circuit,
the first P-type transistor and the N-type transistor are electrically cascaded between the second high-voltage terminal and a low voltage terminal; and
gate electrodes of the first P-type transistor and the N-type transistor are coupled to two ends of the first capacitor element individually;
wherein, the first P-type transistor and the N-type transistor are standard threshold voltage elements.

2. The level shift circuit of claim 1, wherein:
a voltage value at the second high-voltage terminal is higher than a voltage value at the first high voltage terminal; and
a voltage value at the low voltage terminal is lower than a voltage value at the second high-voltage terminal.

3. The level shift circuit of claim 2, wherein the low voltage terminal is a ground terminal.

4. The level shift circuit of claim 1, wherein:
the at least one low threshold voltage element comprises a first phase inverter, a second phase inverter, a second capacitor element, and a second P-type transistor;
an input terminal of the first phase inverter and an input terminal of the second phase inverter receive the input voltage signal;
an output terminal of the first phase inverter is electrically coupled to an end of the second capacitor element;
another end of the second capacitor element is connected to a drain electrode and a substrate of the second P-type transistor;
an output terminal of the second phase inverter is electrically coupled to a gate electrode of the second P-type transistor and configured as an output terminal of the boost circuit;

a first power terminal of the first phase inverter is electrically coupled to the first high voltage terminal;

a first power terminal of the second phase inverter is electrically coupled to the drain electrode of the second P-type transistor;

a source electrode of the second P-type transistor is electrically coupled to the first high voltage terminal; and a second power terminal of the first phase inverter and a second power terminal of the second phase inverter are electrically coupled to the low voltage terminal.

5. The level shift circuit of claim 1, further comprising a third phase inverter and a fourth phase inverter, wherein:

an input terminal of the third phase inverter is electrically coupled to a drain electrode of the first P-type transistor;

an output terminal of the third phase inverter is electrically coupled to an input terminal of the fourth phase inverter; and an output terminal of the fourth phase inverter is configured as an output terminal of the level shift circuit.

6. The level shift circuit of claim 5, wherein the third phase inverter and the fourth phase inverter are the standard threshold voltage elements.

7. The level shift circuit of claim 1, wherein the boost circuit is a charge pump circuit.

8. A level shift circuit, comprising:

a boost circuit electrically coupled to a first high voltage terminal and configured to receive an input voltage signal, wherein the boost circuit comprises at least one low-threshold voltage element and is configured to boost the input voltage signal; and a voltage converting circuit electrically coupled to a second high-voltage terminal, and comprising a low-pass filter circuit, a high-pass filter circuit, an upper switch element and a lower switch element, wherein:

the upper switch element and the lower switch element are electrically cascaded between the second high-voltage terminal and a low voltage terminal, and the low-pass filter circuit and the high-pass filter circuit are electrically connected between a control terminal of the upper switch element and a control terminal of the lower switch element;

wherein, the upper switch element and the lower switch element are standard threshold voltage elements.

9. The level shift circuit of claim 8, wherein the low-pass filter circuit comprises a capacitor element.

10. The level shift circuit of claim 8, wherein the high-pass filter circuit comprises a current mirror circuit or a current source.

11. A level shift circuit, comprising:

a boost circuit electrically coupled to a first high voltage terminal and configured to receive an input voltage signal, wherein the boost circuit is configured to boost the input voltage signal; and a voltage converting circuit electrically coupled to a second high-voltage terminal, and comprising a current source, a first capacitor element, a first P-type transistor and a N-type transistor, wherein:

the current source is electrically coupled between the second high-voltage terminal and the first capacitor element, the first capacitor element is coupled between the current source and an output terminal of the boost circuit, the first P-type transistor and the N-type transistor are electrically cascaded between the second high-voltage terminal and a low voltage terminal; and gate electrodes of the first P-type transistor and the N-type transistor are coupled to two ends of the first capacitor element individually.

* * * * *